(12) United States Patent
Heeren et al.

(10) Patent No.: US 8,546,979 B2
(45) Date of Patent: Oct. 1, 2013

(54) SELF-MATCHING PULSE GENERATOR WITH ADJUSTABLE PULSE WIDTH AND PULSE FREQUENCY

(75) Inventors: Tammo Heeren, Aliso Viejo, CA (US); Fred Mercado, Laguna Hills, CA (US)

(73) Assignee: Alcon Research, Ltd., Fort Worth, TX (US)

( * ) Notice: Subject to any disclaimer, the term of this patent is extended or adjusted under 35 U.S.C. 154(b) by 529 days.

(21) Appl. No.: 12/854,561

(22) Filed: Aug. 11, 2010

(65) Prior Publication Data
US 2012/0038222 A1 Feb. 16, 2012

(51) Int. Cl.
*H03K 3/64* (2006.01)
(52) U.S. Cl.
USPC ........... 307/106; 327/184; 327/291; 327/293; 327/294; 333/20; 333/160
(58) Field of Classification Search
USPC .......................................................... 307/106
See application file for complete search history.

(56) References Cited

U.S. PATENT DOCUMENTS

| | | | |
|---|---|---|---|
| 4,536,723 A * | 8/1985 | Lang et al. .................... | 331/127 |
| 4,597,388 A | 7/1986 | Koziol et al. | |
| 5,869,326 A | 2/1999 | Hoffmann | |
| 5,871,469 A | 2/1999 | Eggers et al. | |
| 5,925,045 A | 7/1999 | Reimels et al. | |
| 6,135,998 A | 10/2000 | Palanker | |
| 6,326,177 B1 | 12/2001 | Schoenbach et al. | |
| 6,479,785 B1 | 11/2002 | Fugo et al. | |
| 6,620,160 B2 | 9/2003 | Lewis et al. | |
| 6,632,193 B1 | 10/2003 | Davison et al. | |
| 6,653,114 B2 | 11/2003 | Walters et al. | |
| 6,730,075 B2 | 5/2004 | Palanker et al. | |
| 6,746,613 B2 | 6/2004 | Korenev | |

(Continued)

FOREIGN PATENT DOCUMENTS

| | | |
|---|---|---|
| DE | 19740530 A1 | 3/1999 |
| WO | WO 0110319 A1 | 2/2001 |
| WO | WO 2005/125287 | 12/2005 |

OTHER PUBLICATIONS

Palanker, Daniel V.; Vankov, Alexander; and Huie, Philip; "Electrosurgery with Cellular Precision;" IEEE Transactions on Biomedical Engineering, vol. 55, No. 2; Feb. 2, 2008; pp. 838-841.

(Continued)

*Primary Examiner* — Rexford Barnie
*Assistant Examiner* — Toan Vu
(74) *Attorney, Agent, or Firm* — Kenneth D. Bassinger

(57) ABSTRACT

Pulse-generator circuits that permit independent control of pulse widths and the delays between successive pulses. In several embodiments, a pulse-generator subcircuit includes a transmission-line segment comprising first and second conductors, configured such that the first conductor is coupled to a first DC potential. The pulse-generator subcircuit further includes a terminating resistor coupled to a first end of the second conductor of the first transmission-line segment; this terminating resistor is matched to the characteristic impedance of the transmission-line segment. The pulse-generator subcircuit further includes first and second switches, controlled by first and second timing signals, respectively, and configured to selectively and independently connect respective first and second ends of the first conductor to a second DC potential. This second potential may be ground, in some embodiments, while the DC potential supplied to the pulse-generator subcircuit by the power-supply subcircuit may range from a very small voltage to voltages exceeding a kilovolt.

14 Claims, 3 Drawing Sheets

(56) References Cited

U.S. PATENT DOCUMENTS

| | | | |
|---|---|---|---|
| 6,773,736 B1 | 8/2004 | De Winter et al. | |
| 6,780,178 B2 | 8/2004 | Palanker et al. | |
| 6,795,728 B2 | 9/2004 | Chornenky et al. | |
| 6,855,143 B2 | 2/2005 | Davison et al. | |
| 6,881,317 B2 | 4/2005 | Huang et al. | |
| 6,937,890 B2 | 8/2005 | Jaroszeski et al. | |
| 6,994,706 B2 | 2/2006 | Chornenky et al. | |
| 7,011,790 B2 | 3/2006 | Ruan et al. | |
| 7,037,694 B2 | 5/2006 | Aksenov et al. | |
| 7,053,063 B2 | 5/2006 | Rubinsky et al. | |
| 7,054,685 B2 | 5/2006 | Dimmer et al. | |
| 7,059,269 B2 | 6/2006 | Korenev | |
| 7,146,210 B2 | 12/2006 | Palti | |
| 7,171,264 B1 | 1/2007 | Hofmann et al. | |
| 7,173,211 B2 | 2/2007 | Coccio et al. | |
| 7,182,762 B2 | 2/2007 | Bortkiewicz et al. | |
| 7,211,083 B2 | 5/2007 | Chornenky et al. | |
| 7,217,268 B2 | 5/2007 | Eggers et al. | |
| 7,220,261 B2 | 5/2007 | Truckai et al. | |
| 7,267,676 B2 | 9/2007 | Chornenky et al. | |
| 7,316,682 B2 | 1/2008 | Konesky | |
| 7,338,656 B2 | 3/2008 | Draghia-Akli et al. | |
| 7,357,802 B2 | 4/2008 | Palanker et al. | |
| 7,395,110 B2 | 7/2008 | Hofmann | |
| 7,419,575 B2 | 9/2008 | Culbertson et al. | |
| 7,429,262 B2 | 9/2008 | Woloszko et al. | |
| 7,435,247 B2 | 10/2008 | Woloszko et al. | |
| 7,445,618 B2 | 11/2008 | Eggers et al. | |
| 2001/0037106 A1 | 11/2001 | Shadduck | |
| 2002/0062126 A1 | 5/2002 | Lewis et al. | |
| 2002/0095147 A1 | 7/2002 | Shadduck | |
| 2003/0208200 A1 | 11/2003 | Palanker et al. | |
| 2004/0176713 A1 | 9/2004 | Garth et al. | |
| 2004/0186466 A1 | 9/2004 | Chornenky et al. | |
| 2004/0193097 A1 | 9/2004 | Hoffmann et al. | |
| 2004/0219660 A1 | 11/2004 | Dev et al. | |
| 2004/0236321 A1 | 11/2004 | Palanker et al. | |
| 2005/0101265 A1* | 5/2005 | Kekez et al. | 455/91 |
| 2005/0161331 A1 | 7/2005 | Huang et al. | |
| 2005/0171523 A1 | 8/2005 | Rubinsky et al. | |
| 2005/0209548 A1 | 9/2005 | Dev et al. | |
| 2005/0211638 A1 | 9/2005 | Schrive et al. | |
| 2005/0220674 A1 | 10/2005 | Shafirstein et al. | |
| 2005/0225371 A1* | 10/2005 | Kim et al. | 327/175 |
| 2006/0028145 A1 | 2/2006 | Mohamed | |
| 2006/0041277 A1 | 2/2006 | Deem et al. | |
| 2006/0062074 A1 | 3/2006 | Gundersen et al. | |
| 2006/0089674 A1 | 4/2006 | Walters et al. | |
| 2006/0118485 A1 | 6/2006 | Gallagher et al. | |
| 2006/0127271 A1 | 6/2006 | Ruan | |
| 2006/0141555 A1 | 6/2006 | Knowles | |
| 2006/0224192 A1 | 10/2006 | Dimmer | |
| 2006/0264805 A1 | 11/2006 | Singh | |
| 2006/0265015 A1 | 11/2006 | Demarais | |
| 2006/0269531 A1 | 11/2006 | Beebe | |
| 2006/0271111 A1 | 11/2006 | Demarais | |
| 2006/0276852 A1 | 12/2006 | Demarais | |
| 2006/0293713 A1 | 12/2006 | Rubinsky | |
| 2006/0293725 A1 | 12/2006 | Rubinsky | |
| 2006/0293730 A1 | 12/2006 | Rubinsky | |
| 2006/0293731 A1 | 12/2006 | Rubinsky | |
| 2007/0029500 A1 | 2/2007 | Coulombe | |
| 2007/0059835 A1 | 3/2007 | Chalberg et al. | |
| 2007/0129761 A1 | 6/2007 | Demarais et al. | |
| 2007/0135875 A1 | 6/2007 | Demarais et al. | |
| 2007/0179535 A1 | 8/2007 | Morrissey et al. | |
| 2007/0219118 A1 | 9/2007 | Lu et al. | |
| 2007/0265215 A1 | 11/2007 | Iverson et al. | |
| 2008/0027428 A1 | 1/2008 | Palanker et al. | |
| 2008/0039832 A1 | 2/2008 | Palanker et al. | |
| 2008/0039901 A1 | 2/2008 | Kronberg et al. | |
| 2008/0045941 A1 | 2/2008 | Fugo | |
| 2008/0099406 A1 | 5/2008 | Ruan et al. | |
| 2008/0119842 A1 | 5/2008 | Palanker et al. | |
| 2008/0125774 A1 | 5/2008 | Palanker et al. | |
| 2008/0167645 A1 | 7/2008 | Woloszko et al. | |
| 2008/0188846 A1 | 8/2008 | Palanker et al. | |
| 2008/0200912 A1 | 8/2008 | Long | |
| 2008/0228244 A1* | 9/2008 | Pakhomov et al. | 607/72 |
| 2008/0231337 A1 | 9/2008 | Krishnaswamy et al. | |
| 2008/0241315 A1 | 10/2008 | Kalum et al. | |
| 2008/0269586 A1 | 10/2008 | Rubinsky et al. | |

OTHER PUBLICATIONS

Gaudreau M.; Hawkey T.; Petry J.; and Kempkes M.; "Solid State Power System for Pulsed Electric Field (PEF) Processing;" 2005 Proc IEEE Pulsed Power Conference; pp. 1278-1281.

Thurston G.B. and Gaertner E.B.; "Viscoelasticity of Electrorheological Fluids During Oscillatory Flow in a Rectangular Channel"; Journal of Rheology, vol. 35 (7), pp. 1327-1343, Oct. 1991.

Palanker D.V., Vankov A., Bilbao K., Marmor M. and Blumenkranz M.S.; "Optimization of the Pulsed Electron Avalanche Knife for Anterior Segment Surgery"; Proc. SPIE vol. 4951, p. 56-61, Ophthalmic Technologies XIII; Jul. 2003 (CD 4951-10).

Woloszko J., Kwende M. and Stalder K.R.; "Coblation in Otolaryngology"; Proc. SPIE vol. 4949, p. 341-352, Lasers in Surgery: Advanced Characterization, Therapeutics, and Systems XIII; Jun. 2003 (See CD 4949-55).

Woloszko J. and Gilbride C.; "Coblation Technology: Plasma-Mediated Ablation for Otolaryngology Applications"; Proc. SPIE vol. 3907, p. 306-316, Lasers in Surgery: Advanced Characterization, Therapeutics, and Systems X; May 2000.

Sebag J. and Hageman G.S.; "Interfaces"; European Journal of Ophthalmology vol. 10, Issue 1, Jan.-Mar. 2000, pp. 1-3.

Palanker D.V., Miller J.M., Marmor M.F., Sanisto S.R., Huie P., Blumenkranz M.S.; "Pulsed Electron Avalanche Knife (PEAK) for Intraocular Surgery"; Invest Ophthal & Vis Science, vol. 42 (11), pp. 2673-2678, Oct. 2001.

Schoenbach, K.H., Joshi R.P., Kolb J.F., Chen N. Stacey, M., Blackmore P.F., Buescher E.S., Beebe S.J.; "Ultrashort Electrical Pulses Open a New Gateway Into Biological Cells"; Proceedings of the IEEE, 92 (7), pp. 1122-1137, Jul. 2004.

Hofmann G.A.; "Instrumentation and Electrodes for in Vivo Electroporation"; Methods in Molecular Medicine vol. 37, Ch. 2, pp. 37-61, 2000.

Stoffels E., Kief I.E., Sladek E.J., Van Der Lann E.P. and Slaaf W.; "Gas Plasma Treatment: A New Approach to Surgery?"; Minicourse 2004 ICOPS (IEEE).

Kim H.B., Ahu S., and Sim S.B.; "Apoptosis by Direct Electric Field (DEF) and Nanosecond Pulsed Electric Field (nsPEF) in Tumor Cells and Tumor Tissues"; ICOPS 2003, 7A01-02, p. 436.

Stalder, K.R., Woloszko J., Brown I.G., and Smith C.D.; "Repetitive Plasma Discharges in Saline Solutions"; Appl. Phys. Lett. 79(27) 4503 (Dec. 31, 2001).

Stalder K.R. and Woloszko J.; "Electrosurgical Plasma Discharges"; Am Phys Society—55th Gaseous Electronic Conference HT2.003 Oct. 2002.

Deng J., Schoenbach K.H., Buescher E.S., and Hair P.S.; "The Effects of Intense Submicrosecond Electrical Pulses on Cells"; Biophysical Journal, vol. 84, pp. 2709-2714, 2003.

Stalder K.R.; "Plasma Characteristics of Electrosurgical Discharges"; Am Physical Soc, Gaseous Electronics Conference, ET1.002, Oct. 2003.

Stoffels E., et al.; "Plasma Needle: A Non-Destructive Atmospheric Plasma Source for Fine Surface Treatment of (Bio)Materials"; Plasma Sources Sci Technol, 11, 383-388 (2002).

Stoffels E., et al.; Superficial Treatment of Mammalian Cells Using Plasma Needle; Phys. D: Appl. Phys. 36, 2908-2913 (2003).

Williams G. and Thomas D.K.; "Phenomenological and Molecular Theories of Dielectric and Electrical Relaxation of Materials"; Nonocontrol GmbH. Application Note Dielectric 3 (1998).

Teague B.D, Wemyss-Holden S.A., Fosh B.G., Dennison A.R. and Maddern G.J.; "Electrolysis and Other Local Ablative Treatments for Non-Resectable Colorectal Liver Metastases"; ANZ-Journal-of-Surgery; 2002; 72/2 (137-141).

Joshi R.P., Hu Q., Schoenbach K.H., and Beebe S.J.; "Energy-Landscape-Model Analysis of Irreversibility and Its Pulse-Width Dependence in Cells Subjected to High Intensity Ultrashort Electric Pulse"; Physical Review E 69, 051901-1, 2004.

White J.A., Blackmore P.F., Schoenbach K.H. and Beebe S.J.; "Stimulation of Capacitive Calcium Entry in HL-60 Cells by Nanosecond Pulsed Electric Fields"; Journal of Biological Chemistry, vol. 279 (22), pp. 22964-22972.

Gaudet J.A., Buchenauer C.J., Dickens J., Joshi R.P., Kolb J.F., Neuber A., Schamiloglu E., and Tyo J.S.; "Research Issues in Developing Compact Pulsed Power for High Peak Power Applications on Mobile Platforms"; Proceedings of the IEEE, vol. 92 (7), pp. 1144-1165, Jul. 2004.

Pakhomov A.G., Phinney A., Anshmore J., Walker K., Kolb J. and Kono S.; "Characterization of the Cytotoxic Effect of High-Intensity, 10-ns Duration Electrical Pulses"; TPS0419.R1, US Army Medical Research DAMD 17-94-C-4069, Oct. 2003.

Beebe S.J., White J., Blackmore P.F., Deng Y., Somers K., and Schoenbach K.H.; "Diverse Effects of Nanosecond Pulsed Electric Fields on Cells and Tissues"; DNA and Cell Biology, vol. 22 (12), 2003.

Chen N., Schoenbach K.H., Kolb J.F., Swanson R.J., Garner A.L., Yang J., Joshi R.P., and Beebe S.J.; "Leukemic Cell Intracellular Responses to Nanosecond Electric Fields"; Biochemical and Biophysical Research Communications 317 (2004) pp. 421-427.

Stacey M., Stickley J., Fox P., Statler V., Schoenbach K., Beebe S.J. and Buescher S.; "Differential Effects in Cells Exposed to Ultra-Short, High Intensity Electric Fields: Cell Survival, DNA Damage, and Cell Cycle Analysis"; Mutation Research 542 (2003) pp. 65-75.

Joshi R.P., Hu Q. and Schoenbach K.H.; "Dynamical Modeling of Cellular Response to Short-Duration, High-Intensity Electric Fields"; IEEE Tansactions on Dielectrics and Electrical Insulation, vol. 10 (5), Oct. 2003, pp. 778-787.

Buescher E.S. and Schoenbach K.H.; "Effects of Submicrosecond, High Intensity Pulsed Electric Fields on Living Cells-Intracellular Electromanipulation"; IEEE Transactions on Dielectrics and Electrical Insulation, vol. 10 (5), Oct. 2003, pp. 788-794.

Beebe S.J., Fox P.M., Rec L.J.; Willis L.K. and Schoenbach K.H.; "Nanosecond, High-Intensity Pulsed Electric Fields Induce Apoptosis in Human Cells"; FASEB Journal, Express Article 10, 1096/fj.02-0859fje. Published online Jun. 17, 2003.

Hair P.S., Schoenbach K.H. and Buescher E.S.; "Sub-Microsecond, Intense Pulsed Electric Field Applications to Cells Show Specificity of Effects"; Bioelectrochemistry, vol. 61, pp. 65-72, 2003.

Block H. and Kelly J.P.; "Electro-Rheology Review Article"; J. Phys. D: Appl. Phys. 21 1661-1677, 1988.

Ikazaki F., Kawai A., Uchida K., Kawakami K.T., Edamura K., Sakurai K., Anza H. and Asako Y.; "Mechanisms of Electrorheology: The Effects of the Dielectric Property"; J. Phys. D: Appl. Phys. 31 336-347, 1998.

Matthews J.A., Wnek G.E., Simpson D.G, and Bowlin G.L.; "Electrospinning of Collagen Nanofibers"; Biomacromolecules. Mar.-Apr. 2002; 3 (2): 232-8.

Binhi V.N., and Goldman R.J.; "Ion-Protein Dissociation Predicts 'Windows' in Electric Field-Induced Wound-Cell Proliferation"; Biochim-Biophys-Acta. Apr. 6, 2000; 1474(2): 147-56.

Fukada E.; "Electrical Phenomena in Biorheology"; Biorheology. 1982; 19(1/2): 15-27.

Puzas, J.E., Vignery A. and Rasmussen H.; "Isolation of Specific Bone Cell Types by Free-Flow Electrophoresis"; Calcified Tissue International. Jul. 3, 1979; 27(3): 263-8.

Behrend M., Kuthi A., Gu X., Vernie G.P., Marcu L. Craft C.M. and Gundersen M.A.; "Pulse Generators of Pulsed Electric Field Exposures of Biological Cells and Tissues"; IEEE Trans on Dielectrics and Electrical Insulation, vol. 10, No. 5, pp. 820-825, Oct. 2003.

Deng J., Stark R.H. and Schoenbach K.H.; "A Nanosecond Pulse Generator for Intracellular Electromanipulation"; 24th International Power Modulation Symposium, pp. 47-50, 2000.

Polk C., "Biological Applications of Large Electric Fields: Some History and Fundamentals"; IEEE Transactions on Plasma Science, vol. 28 (1), pp. 6-14, Feb. 2000.

Rosche S., "Solid State Pulsed Power Systems"; (White Paper); Physique & Industrie, 17 Run de la Rente Logerot, 21160 Marsannay La Cote, France.

Wijetunga P., Gu X., Vernier P.T., Kuthi A., Behrend M. and Gundersen M.A.; "Electrical Modeling of Pulsed Power Systems for Biomedical Applications"; Abstract No. #10324 Preprint mag@usc.edu.

Mankowski J. and Kristiansen M.; "A Review of Short Pulse Generator Technology"; IEEE Transactions on Plasma Science, vol. 28 (1), pp. 102-108 Feb. 2000.

Xiao S., Kolb J., Kono S., Katsuki S., Joshi R.P., Laroussi M. and Schoenback K.H,; "High Power, High Recovery Rate Water Switch"; Abstract #10672 Preprint.

Sampayan S., Caporaso G., Carder B., Chen Y., Holmes C., Lauer E., and Trimble D.; "High Gradient Insulator Technology for the Dielectric Wall Accelarator"; US Depart of Energy, Lawrence Livermore National Laboratory contract No. W-7405-Eng-48.

Van Heesch E.J.M., Pemen A.J.M., Huigbrechts A.H.J., Van Der Lanna P.C.T., Ptasinski K.J.,Zanstra G.J. and De Jong P.; "A Fast Pulsed Power Source Applied to Treatment of Conducting Liquids and Air"; IEEE Transactions on Plasma Science, vol. 28 (1), Feb. 2000.

Lu X.P., Laroussi M., Kolb J., Kono S., and Schoenbach K.H.; "Temporal Emission Behavior of Pulsed Discharge in Water"; Reprint.

Tyo J.S., Skipper M.C., Abdalla M.D., Romero S.P. and Cockreham B.; "Frequency and Bandwidth Agile Pulser for Use in Wideband Applications"; IEEE Transactions on Plasma Science, Pulsed Power Technology Jan. 2004.

Kolb J., Kono S., Xiao S., Goan B., Lu X.P., Bickes C., Laroussi M., Joshi R.P., Schoenbach K. and Schamiloglu E.; "Water and Propylene Carbonate as Storage and Switching Media in Pulsed Power Systems"; Abstract No. #10699 Preprint.

Kuthi A., Young C., Wang F., Wijetunga P. and Gundersen M.; "Rapid Charger for High Repetition Rate Pulse Generator"; Abstract No. #10320 Preprint.

Miller J.M, Palanker D.V., Vankov A., Marmor M.F., and Blumenkranz M.S.; "Precision and Safety of the Pulsed Electron Avalanche Knife in Vitreoretinal Surgery"; Arch Ophthalmology, vol. 121, pp. 871-877, Jun. 2003.

Grekhov I., Korotkov S., Stepaniants A., Khristyuk D. and Voronkov V.; "High Power Semiconductor-Based Nano and Subnanosecond Pulse Generator with a Low Delay Time"; Loffe Institute RAS, 26 Poytekhicheskaya, St. Peterburg, 194021, Russia.

Han J. and Singh A.K.; "Rapid Protein Separations in Ultra-Short Microchannels: Microchip Sodium Dodecyl Sulfate-Polyacrylamide Gel Electrophoresis and Isoelectric Focusing"; Journal of Chromatography A, vol. 1049 (1-2), Sep. 2004, pp. 205-209.

Bazant M.Z. and Squires T.M.; "Induced-Charge Electrokinetic Phenomena: Theory and Microfluidic Applications"; Physical Review Letters, vol. 92 (6), pp. 066101-1 to 066101-4, Feb. 2004.

Squires T.M. and Bazant M.Z.; "Induced-Charge Electro-Osmosis"; J. Fluid Mechanics vol. 509, pp. 217-252, 2004.

Lin M.P., Marti G.P., Dieb R., Wang J., Qaiser R., Bonde P., Duncan M.D. and Harmon J. W.; "Electroporation Improves Transfection Efficiency in Rat Wound Healing Model"; J. American College of Surgeons, vol. 199 (3), Supp 1 , Sep. 2004, pp. 58-59.

Laroussi M., "Biological Decontamination by Non-Equilibrium Plasmas: High Pressure Case"; Minicourse, ICOPS 2004, Baltimore, MA.

Lao Aik, Tra D., and Hsing IM; "Miniaturized Flow Fractionation Device Assisted by a Pulsed Electric Field for Nanoparticle Separation"; Anal. Chem, vol. 74, pp. 5364-5369, 2002.

Palanker D.V., Marmor M.F., Branco A., Huie P., Miller J.M., Sanislo S.R., Vankov A., and Blumenkranz M.S.; "Effects of Pulsed Electron Avalanche Knife on Retinal Tissue"; Arch Ophthalmol, vol. 120, pp. 636-640, 2002.

Garner H. Hofman, GA, Dev S.B. and Nanda G.S.; "Electrochemotherapy: Transition from Laboratory to the Clinic"; Engineering in Medicine and Biology Magazine, IEEE, vol. 15 (6), pp. 124-132, Nov.-Dec. 1996.

Vernier P.T., Li A., Marcu L., Craft C.M. and Gundersen M.A.; "Ultrashort Pulsed Electric Fields Induce Membrane Phospholipid Translocation and Caspase Activation: Differential Sensitivities of Jurkat T. Lymphoblasts and Rat Glioma C6 Cells"; IEEE Transactions on Dielectrics and Electrical Insulatiion vol. 10, No. 5; Oct. 2003 795.

Kuthi A., Behrend M., Vernier T., and Gundersen M.; "Bipolar Nanosecond Pulse Generation Using Transmission Lines for Cell Electro-Manipulation"; Dept. EE—Electrophysics—USC Los Angeles, CA 90089-0271.

Sata M., Ohgiyama T. and Clements J.S.; "Formation of Chemical Species and Their Effects on Microorganisms Using a Pulsed High-Voltage Discharge in Water"; IEEE Trans on Indust Appl, vol. 32 (1), Jan./Feb. 1996.

O'Malley C. and Heintz R.M.; "Electrovitreotomy"; Am J. Opthalmol. 76(3), pp. 336-342, Sep. 1973.

O'Malley C. and Heintz R.M.; Electrovitreotomy, 2. Principals and Results; Br. J. Ophthalmol, 59 (10), pp. 580-585, Oct. 1975.

Hennig J.; "Diathermic Vitrectomy in Anterior Segment Surgery"; Advances in Vitreous Surgery: [1974: San Francisco proceedings], edited by Irvine AR and O'Malley C. Springfield, Ill: Thomas, Published 1976; Chapter 42, pp. 463-467.

Reschiglian P., Zattoni A., Roda B., Michelini E., and Roda A.; "Field-Flow Fractionation and Biotechnology"; Trends in Biotechnology vol. 23 (9), p. 475-483, Sep. 2005.

Nuccitelli R., Pliquett U., Chen X., Ford W., Swanson R.J., Beebe S.J., Kolb J.F., and Schoenbach K.H.; "Nanosecond Pulsed Electric Fields Cause Melanomas to Self-Destruct"; Biochemical and Biophysical Research Communications, vol. 343 (2), pp. 351-360, May 2006.

Schrive L., Grasmick A., Moussiere S., Sarrade S.; "Pulsed Electric Field Treatment of *Saccharomyces cerevisiae* Suspensions: A Mechanistic Approach Coupling Energy Transfer, Mass Transfer and Hydrodynamics"; Biochemical Engineering, Journal 27 (2006) 212-224.

Focia R.J. and Frost C.A.; "A Compact, Low Jitter, 1 Khz Pulse Repetition Rate Gasswitched Pulse Generator System"; Preprint of 2005 Pulsed Power Conference Paper.

Jayaram S.H. and Boggs S.A.; "Optimization of Electroporation Wavesforms for Cell Sterilization"; 2004 Proce IEEE, on Industry Application vol. 40, pp. 1489-1497.

Chalemchat Y., Dejmek P.; "Effects of Pulsed Electric Field Pretreatment on Solid-Liquid Expression From Potato Tissue"; Journal of Food Engineering 71 (2005) 164-169.

Jayaram S.H., El-Hag A.H. Espino-Cortes F.P., Wong R.J. and Leibovitch C.; "Effects of Process and Product Parameters on the Shape of Nanosecond Pulses Used in High-Field Liquid Food Treatment"; IEEE Transactions on Industry Applications, vol. 41, No. 2, Mar./Apr. 2005.

Sek S., Swiatek K., and Misicka A.; "Electrical Behavior of Molecular Junctions Incorporating r-Helical"; Journal of Physical Chemistry B 2005, 109, 23121-23124 Nov. 17, 2005.

Hall E.H., Schoenbach K.H. and Beebe S.J.; "Nanosecond Pulsed Electric Fields (nsPEF) Induce Direct Electric Field Effects and Biological Effects on Human Colon Carcinoma Cells"; DNA and Cell Biology vol. 24, No. 5, 2005, pp. 283-291.

Chen Z. and Chauhan A.; "Separation of Charged Colloids by a Combination of Pulsating Lateral Electric Fields and Poiseuille Flow in a 2D Channel"; Journal of Colloid and Interface Science 282 (2005) 212-222.

Coa J.G., Huang J.P., and Zhou L.W.; "Structure of Electrorheological Fluids Under an Electric Field and a Shear Flow: Experiment and Computer Simulation"; J. Phys. Chem. B2006, 100, 11635-11639.

Kolb J.F., Kono S.; Schoenbach K.H.; "Nanosecond Pulsed Electric Field Generators for the Study of Subcellular Effects"; Bioelectromagnetics. Apr. 2006; 27(3): 172-87.

Mahrour N., Pologea-Moraru R., Moisescu M.G., Orlowski S., Leveque P., and Mir L.M.; "In Vitro Increase of the Fluid-Phase Endocytosis Induced by Pulsed Radiofrequency Electromagnetic Fields: Importance of the Electric Field Component"; Biochim-Biophys-Acta. Feb. 1, 2005; 1668(1): 126-37.

Alexander Vankov and Daniel Palanker; "Nanosecond Plasma-Mediated Electrosurgery With Elongated Electrodes"; Journal of Applied Physics 101; Published online Jun. 19, 2007; pp. 124701-124707.

V. Heinz, I. Alvarez, A. Angersbach, and D. Knorr; "Preservation of Liquid Foods by High Intensity Pulsed Electric Fields—Basic Concepts for Process Design"; Trends in Food Science & Technology 12 (2002); pp. 103-111.

Ytaiji Sakamoto, Toshio Hisatomi, Chikako Tsutsumi, Yukio Sassa, Tatsuro Ishibashi, and Hajime Inomata; "Targeted Gene Transfer to Corneal Stroma in Vivo by Electric Pulses"; 2002 Elsevier Science Ltd.; pp. 191-198.

Mari Dezawa, Masahiko Takano, Hisanari Negishi, Xiaofen Mo, Toshiyuki Oshitari, and Hajime Sawada; "Gene Transfer Into Retinal Ganglion Cells by in Vivo Electroporation: A New Aproach"; Micron 33 (2002); pp. 1-6.

Tammo Heeren, Takahisa Ueno, Douyan Wang, Takao Namihira, Sunao Katsuki, and Hidenori Akiyama; "Noval Dual Marx Generator for Microplasma Applications"; IEEE Transactions on Plasma Science, vol. 33, No. 4 Aug. 2005; pp. 1205-1209.

Karl H. Schoenbach, Richard Nuccitelli and Stephen J. Beebe; "Zap—Extreme Voltage Could Be a Suprisingly Delicate Tool in the Fight Against Cancer"; IEEE Spectrum; Aug. 2006; pp. 20-26.

Matthew R. Behrend, Yinghua Sun, P. Thomas Vernier, Andras Kuthi, and Martin A. Gundersen; "Four-Channel Pulse Generator for Real-Time Biological Investigations"; Department of Electrical Engineering—Electrophysics University of Southern California, Los Angeles, CA 90089-0271; Abstract #67.

L. Zhang and D.P. Rabussay; "Clinical Evaluation of Safety and Human Tolerance of Electrical Sensation Induced by Electric Fields with Non-Invasive Electrodes"; Elsevier; Bioelectrochemisty 56 (2002); pp. 233-236.

Dawn J. Bennett, Boris Khusid, Conrad D. James, Paul C. Galambos, Murat Okandan, David Jacqmin, and Andreas Acrivos; "Combined Field-Induced Dielectrophoresis and Phase Separation for Manipulating Particles in Microfluidics"; Applied Physics Letters; vol. 83; No. 23; Dec. 8, 2003; pp. 4866-4868.

C. Faurie, M. Golzio, E Phez, J. Teissie, and M.P. Rols; "Electric Field-Induced Cell Membrane Permeabilization and Gene Transfer: Theory and Experiments"; Eng. Life Sci. 2005, 5, No. 2 pp. 179-186.

Siegfried G. Pringlinger, MD., Christos Haritoglou, MD., Arthur Mueller, MD., Martin Grueterich, MD., Rupert W. Strauss, MD., Claudia S. Alge, MD., Arnd Gandorfer, MD., Daniel Palanker PhD, and Anselm Kampik, MD.; "Pulsed Electron Avalanche Knife in Vitreoretinal Surgery"; Retina, The Journal of Retinal and Vitreous Diseases, 2005, vol. 25, No. 7, pp. 889-896.

Liron Miller, M.Sc., Jonathan Leor, MD., and Boris Rubinsky, PhD.; "Cancer Cells Ablation With Irreversible Electroporation"; Technology in Cancer Research & Treatment; ISSN 1533-0346; vol. 4, No. 6, Dec. 2005; pp. 699-705.

R.V. Davalos, L.M. Mir, and B. Rubinksy; "Tissue Ablation With Irreversible Electroporation"; Annals of Biomedical Engineering, vol. 33, No. 2, Feb. 2005; pp. 223-231.

Zhi Chen and Anuj Chauhan; "Electrochemical Response and Separation in Cyclic Electric Field-Flow Fractionation"; Electrophoresis 2007, 28; pp. 724-739.

Riad Antoine Bejjani, MD., Charlotte Andrieu, PhD., Carole Bloquel, PhD., Marianne Berdugo, VetD, David Benezzra, MD., PhD, and Francine Behar-Cohen, MD., PhD.; "Electrically Assisted Ocular Gene Therapy"; Survey of Ophthalmology; vol. 52, No. 2; Mar.-Apr. 2007; pp. 196-208.

Edward B. Garon, David Sawcer, P. Thomas Vernier, Tao Tang, Yinghua Sun, Laura Marcu, Martin A. Gundersen and H. Phillip Koeffler; "In Vitro and in Vivo Evaluation and a Case Report of Intense Nanosecond Pulsed Electric Field as a Local Therapy for Human Malignancies"; Int. J. Cancer; 121; pp. 675-682; (2007).

Siegfried G. Priglinger, MD., Christo Haritoglou, MD., Daniel Palanker, PhD., Daniel Kook, MD., Martin Grueterich, MD., Arthur Mueller, MD., Claudia S. Alge, MD., and Anselm Kampik, MD.; "Pulsed Electron Avalanche Knife for Capsulotomy in Congenital and Mature Cataract"; J Cataract Refract Surg, Jul. 2006; vol. 32, pp. 1085-1088.

Udayan K. Shah, MD.; "Coblation for Tonsillectomy in Children: An Evidence-Based Update on Maturing Technology"; Proc. of SPIE, vol. 6424; pp. 64241H-1 thru 64241H-12 (2007); doi: 10.1117/12.702641; Photonic Therapeutics and Diagnostics III.; Online Publication date Mar. 8, 2007.

M.B. Fox, D.C. Esveld, and R.M. Boom; "Conceptual Design of a Mass Parallelized PEF Microreactor"; Trends in Food Science & Technology 18 (2007); pp. 484-491.

Siegfried G. Priglinger, MD., Christos Hartoglou, MD., Daniel V. Palanker, PhD., Claudia S. Alge, MD., Arnd Gandorfer, MD.; and Anselm Kampik, MD.; "Pulsed Electron Avalance Knife (PEAK-fc) for Dissection of Retinal Tissue"; Arch Ophthalmol Oct. 2005; vol. 123; pp. 1412-1418.

Siegfried G. Pringlinger, Daniel Palanker, Claudia S. Alge, Thomas C. Kreutzer, Christo Haritoglou, Martin Grueterich, and Anselm Kampik; "Pulsed Electron Avalanche Knife: New Technoloyg for Cataract Surgery"; Br J Ophthalmol; 2007; vol. 91; pp. 949-954.

Sunao Katsuki, Naoyuki Nomura, Hideto Koga, Hidenori Akiyama, Ichiro Uchida, and Shin-Ichi Abe; "Biological Effects of Narrow Band Pulsed Electric Fields"; IEEE Transactions on Dielectrics and Electrical Insulation; vol. 14, No. 3; Jun. 2007; pp. 663-668.

Gregory Fridman, Alexey Shereshevsky, Maria Peddinghaus, Alexander Gutsol, Victor Vasilets, Ari Brooks, Manjula Balasubramanian, Gary Friedman, and Alexander Fridman; "Bio-Medical Application of Non-Thermal Atmospheric Pressure Plasma"; 37th AIAA Plasmadynamics and Laser Conference Jun. 5-8, 2006, San Francisco, CA.

Fridman G., Peddinghaus M., Ayan H., Fridman A., Balasubramanian M., Gustol A., Brooks A., and Friedman G.; "Blood Coagulation and Living Tissue Sterilization by Floating-Electrode Dielectric Barrier Discharge in Air"; Plasma Chem Plasma Process: DOI 10-1007/s11090-006-9024-4. vol. 26, No. 4/Aug. 2006; pp. 425-442.

Fridman G., Shereshevsky A., Jost M., Brooks A., Fridman A., Gutsol A., Vasilets V., and Friedman G.; "Floating Electrode Dielectric Barrier Discharge Plasma in Air Promoting Apoptotic Behavior in Melanoma Skin Cancer Cell Lines"; Plasma Chem Plasma Process DOI 10.1007/s11090-007-9048-4; vol. 27, No. 2; Apr. 2007; pp. 163-176.

Gregory Fridman, Ari D. Brooks, Manjula Balasubramanian, Alexander Fridman, Alexander Gutsol, Victor N. Vasilets, Halim Ayan, and Gary Friedman; "Comparison of Direct and Indirect Effects of Non-Thermal Atmospheric-Pressure Plasma on Bacteria"; Plasma Processes and Polymers; 2007; vol. 4, pp. 370-375.

P. Sarkar, B.M. Novac, I.R. Smith, and R.A. Miller; "A High-Repetition Rate Closing Switch for EMP Applications"; Department of Electronic and Electrical Engineering, Loughborough University, Loughborough, Leicestershire LE11 3TU, UK; Dstl, Electronics Dept., Malvern, Worcestershire WR13 3PS, UK.

Jakob Oblak, Dejan Krizaj, Slavko Amon, Alenka Macek-Lebar, and Damijan Miklavcic; "Feasibility Study for Cell Electroporation Detection and Separation by Means of Dielectrophoresis"; ScienceDirect; Bioelectrochemistry 71 (2007); pp. 164-171.

Nianyong Chen, Allen L. Garner, George Chen, Yu Jing, Yuping Deng, R. James Swanson, Juergen F. Kolb, Stephen J. Beebe, Ravindra P. Joshi, and Karl H. Schoenbach; "Nanosecond Electric Pulses Penetrate the Nucleus and Enhance Speckle Formation"; ScienceDirect; Biochemical and Biophysical Research Communication 364 (2007); pp. 220-225.

Xin Chen, Chenguo Yao, Chengxiang Li, Caixin Sun, Yan Mi, Cong Li, Lina Hu; "Frequency Response Model and Simulation of Transmembrane Potentials on Cellular Inner and Outer Membranes"; Proceedings of the 29th Annual International Conference of the IEEE EMBS; Aug. 23-26, 2007; pp. 5818-5821.

Satoshi Shiina, Takayuki Ohshima, and Masayuki Sato; "Extracellular Release of Recombinant a-Amylase from *Escherichia coli* Using Pulsed Electric Field"; Biotechnol Prog. 2004, vol. 20, pp. 1528-1533.

Pavitra Krishnaswamy, Andras Kuthi, P. Thomas Vernier, and Martin A. Gundersen; "Compact Subnanosecond Pulse Generator Using Avalanche Transistors for Cell Electroperturbation Studies"; IEEE Transactions on Dielectrics and Electrical Insulation; vol. 14; No. 4; Aug. 2007; pp. 871-877.

U. Koners, W. Schmidt, M. Loffler, V. Heinz, and D. Knorr; "The Effect of Implemented Pulsed Electric Field (PEF) Treatment on the Dehydrogenase Activity of Activated Sludge"; WIT Transactions on Ecology and the Environment; vol. 95; 2006; pp. 379-388.

M.B. Fox, D.C. Esveld, H. Mastwijk, and R.M. Boom; "Inactivation of L. Plantarum in a PEF Microreactor the Effect of Pulse Width and Temperature on the Inactivation"; ScienceDirect; Innovative Food Science and Emerging Technologies; vol. 9; 2008; pp. 101-108.

David A. Zaharoff, Joshua W. Henshaw, Brian Mossop and Fan Yuan; "Mechanistic Analysis of Electroporation-Induced Cellular Uptake of Macromolecules"; Department of Biomedical Engineering, Duke University, 136 Hudson Hall, Durham, North Carolina 27708; pp. 94-105.

Jue Zhang, Peter F. Blackmore, Barbara Y Hargrave, Shu Xiao, Stephen J. Beebe, and Karl H. Schoenbach; "Nanosecond Pulse Electric Field (Nanopulse): A Novel Non-Ligand Agonist for Platelet Activation"; ScienceDirect; Archives of Biochemistry and Biophysics; vol. 471; 2008; pp. 240-248.

Che-Hsin Lin; Jing-Hui Wang, and Lung-Ming Fu; "Improving the Separation Efficiency of DNA Biosamples in Capillary Electrophoresis Microchips Using High-Voltage Pulsed DC Electric Fields"; Microfluid Nanofluid; Dec. 2007; Research Paper.

P. Thomas Vernier, Yinghua Sun, Meng-Tse Chen, Martin A. Gundersen, and Gale L. Craviso; "Nanosecond Electric Pulse-Induced Calcium Entry Into Chromaffin Cells"; Bioelectrochemisty 73; 2008; pp. 1-4.

S. Kono, T. Ono, K. Hirayama, and K. Matsushita; "Biological Effects of Pulsed Electric Field by Several Ways of Applying Voltage"; 2005 Proc. IEEE Pulsed Power Conference, pp. 1425-1428.

M. Gaudreau, T. Hawkey, J. Petry, and M. Kempkes; "Solid-State Power Systems for Pulsed Electric Field (PEF) Processing"; 2005 Proc IEEE Pulsed Power Conference; pp. 1278-1281.

Satoshi Uchida, Makoto Houjo, and Fumiyoshi Tochikubo; "Efficient Sterilization of Bacteria by Pulse Electric Field in Micro-Gap"; Journal of Electrostatic 66 (2008); pp. 427-431.

Guanbin Song, Jian Qin, Chengguo Yao, and Yang Ju; "Effect of Steep Pulsed Electric Field on Proliferation, Viscoelasticity and Adhesion of Human Hepatoma SMMC-7721 Cells"; Anticancer Research 28; 2008; pp. 2245-2251.

Seacheol Min, Gulsun Akdemir Evrendilek, and Howard Q. Zhang; "Pulsed Electric Fields: Processing System, Microbial and Enzyme Inhibition, and Shelf Life Extension of Foods"; IEEE Transactions on Plasma Science, vol. 35; No. 1 Feb. 2007; pp. 59-73.

N.K. Kishore, Sriram Sarma Emani, T.K. Maiti, and Gobind Singh Bisht; "Studies on Pulsed Electric Field Applications for Food Sterilization"; Second International Conference on Industrial and Information Systems, ICIIS 2007, Aug. 8-11, 2007; pp. 497-502.

Richard Nuccitelli, Uwe Pliquett, Xinhua Chen, Wentia Ford, R. James Swanson, Stephen J. Beebe, Juergen F. Kolb, and Karl H. Schoenbach; "Nanosecond Pulsed Electric Fields Cause Melanomas to Self-Destruct"; ScienceDirect; Biochemical and Biophysical Research Communication 343; 2006; pp. 351-360.

Chen, M-T, et al.; "Two Dimensional Nanosecond Cell Electropermeabilization"; PMC Biophysics, 2009; (2(9), 16 pages.

Sanders, J.M, et al.; "A Linear, Single-Stage, Nanosecond Pulse Generator for Delivering Intense Electric Fields to Biological Loads" IEEE Transactions on Dielectrics and Electrical Insulation, Aug. 2009, 16(4); pp. 1048-1054.

M. Ishii; "Self-Matched High-Voltage Rectangular Wave Pulse Generator"; Institue of Industrial Science, University of Tokyo, Tokyo 106, Japan; H. Yamada; Department of Electrical Engineering, Iwate University, Morioka 020, Japan; Rev. Scl Instrum; vol. 56, No. 11, Nov. 1985; pp. 2116-2118.

* cited by examiner

SELF-MATCHING PULSE GENERATOR WITH ADJUSTABLE PULSE WIDTH AND PULSE FREQUENCY

TECHNICAL FIELD

The present invention relates generally to circuits for generating electrical pulses, and more particularly to high-voltage pulse-generator circuits employing transmission lines as energy storage devices.

BACKGROUND

High-voltage pulse-generator circuits are useful in a wide variety of applications, from long-distance radio communications to intricate surgical procedures involving the application of high-intensity pulsed electric fields to the lens of the human eye. Many of these applications require tight control of the pulse shapes and durations, even in the face of wide variations in the characteristics of the loads receiving the pulses.

Simple high-voltage pulse generators using transmission-line devices for energy storage have been used for several decades. One such device, pictured in FIG. 1, was described by Ishii, et al., in the article "Self-matched high-voltage rectangular wave pulse generator," published November 1985 in the *Review of Scientific Instruments*, vol. 81(11). A similar device, using a spark discharge device in place of the switch S1 pictured in FIG. 1, is described in U.S. Pat. No. 4,536,723, issued 20 Aug. 1985 to Lang et al., and titled "High-Power Pulse Generator Using Transmission Line with Spark Discharge Device." The entire contents of U.S. Pat. No. 4,536,723 are incorporated by reference herein, to provide background for the below description of improved pulse-generator circuits.

The detailed operation of the circuit of FIG. 1 is described in the Ishii article. Transmission line 100 serves as a capacitive energy-storage device. Here, transmission line 100 is illustrated as a segment of coaxial cable, although other transmission lines might also be used. The coaxial cable segment has an inner conductor and an outer conductor, with suitable insulation between the conductors. In the illustrated circuit, the outer conductor of transmission line 100 is charged to voltage $V_{SUPPLY}$ by power supply 110, through charging resistor $R_C$. A terminating resistor $R_T$ is connected to the inner conductor at one end of transmission line 100; for best operation (i.e., to minimize pulse reflections propagating towards the load), the value of $R_T$ is selected to match the characteristic impedance $Z_0$ of transmission line 100. Thus, for example, a 50 ohm resistor should be used to terminate a coaxial cable segment having a nominal characteristic impedance of 50 ohms. The other end of the inner conductor of transmission line 100 is connected to the load $Z_L$—as discussed in further detail below, the operation of this pulse-generator circuit is generally insensitive to the impedance of load $Z_L$, insofar as reflection-free operation is concerned.

When the outer conductor of transmission line 100 is charged to $V_{SUPPLY}$, the closing of switch S1 simultaneously shorts both ends of the outer conductor to ground, initiating the simultaneous launch of traveling waves from both ends of the transmission line towards its center. If $V_{SUPPLY}=-2$ (an assumption that simplifies the following expressions), the traveling wave launched from the load end of transmission line 100 has an amplitude of $(\alpha_1-2)$, where the refraction coefficient $\alpha_1$ equals $2Z_L/(Z_0+Z_L)$, and $Z_0$ is the characteristic impedance of transmission line 100. The traveling wave launched from the other end has an amplitude of $(\alpha_2-2)$, where $\alpha_2=2R_T/(Z_0+R_T)$. If the terminator resistor $R_T$ is selected to match the characteristic impedance of transmission line 100, then $\alpha_2=1$.

With the simplifying assumption that transmission line 100 is lossless (and assuming that $R_T$ is matched to $Z_0$), it can be shown that the voltage across the load $Z_L$, relative to the switch's closing at time t=0, is given by:

$$\begin{cases} V_L = \alpha_1, & \text{for } t = 0 \text{ to } \tau \\ V_L = 0, & \text{otherwise,} \end{cases}$$

where $\tau$ is the electrical length of transmission line 100. In other words, the voltage waveform across $Z_L$ is a simple rectangular pulse having an amplitude of $\alpha_1$ and a duration of $\tau$. Importantly, the pulse's duration, which is established solely by the electrical length of the transmission line, is independent of the impedance of the load $Z_L$.

Those skilled in the art will understand that the inner and outer conductors of transmission line 100 are electrically interchangeable. Thus, the components of FIG. 1 that are connected to the outer conductor of transmission line 100 may be instead connected to the inner conductor of transmission line 100, and vice-versa, without changing the basic operation of the circuit. Of course, the practical impact may be much more significant; thus the pictured configuration may be more convenient to implement. The same is true with respect to all of the schematic illustrations provided herein—while those illustrations suggest particular configurations with respect to the inner and outer conductors of one or more coaxial transmission lines, those skilled in the art will appreciate that the conductors of a transmission line are generally electrically, if not physically, interchangeable.

SUMMARY

As described more fully below, several embodiments of the present invention include pulse-generator circuits that permit independent control of pulse widths and the delays between successive pulses. In some embodiments, two pulse-generator subcircuits are combined to produce positive-going and negative-going pulses, which can be independently controlled. With these circuits, high-voltage pulses of dual polarity can be delivered to a target that is physically separated from the pulse-generator circuit. The target load does not need to be matched to the pulse-generator circuit to deliver reflection-free pulses. Thus, these circuits are useful in applications where the load impedance is unknown, varying, or simply difficult to match. While these applications include ophthalmic surgery where high-voltage pulsed energy is delivered to a subject eye, those skilled in the art will appreciate that the techniques and circuits disclosed herein are not limited in their application to the fields of ophthalmology or to medical devices.

In several embodiments, a circuit comprises a pulse-generator subcircuit and a power-supply subcircuit configured to supply a DC potential to the pulse-generator subcircuit. In these embodiments, the pulse-generator subcircuit includes a transmission-line segment comprising first and second conductors, configured such that the first conductor is coupled to the power-supply subcircuit. This coupling may be via a simple isolating charging resistor, in some embodiments. The pulse-generator subcircuit further includes a terminating resistor coupled to a first end of the second conductor of the first transmission-line segment; this terminating resistor is matched to the characteristic impedance of the transmission-line segment, in many embodiments. The pulse-generator subcircuit further includes first and second switches, controlled by first and second timing signals, respectively, and configured to selectively and independently connect respective first and second ends of the first conductor to a second DC potential. This second potential may be ground, in some embodiments, while the DC potential supplied to the pulse-generator subcircuit by the power-supply subcircuit may range from a very small voltage to voltages exceeding a kilovolt.

In some embodiments, the transmission-line segment may consist of one or more segments of a coaxial transmission line, such that the first conductor in the above-described embodiments corresponds to the outer conductor of the coaxial transmission-line segment, while the second conductor corresponds to the coaxial transmission-line segment's inner conductor. Other transmission line structures may be suitable in some applications. In some embodiments, the transmission-line segment of the pulse-generator subcircuit may comprise two subsegments connected in series and such that the second conductor is connected to the second DC potential at a point between the two subsegments.

Several embodiments of the circuits described above may further comprise an inverting delay-line subcircuit to invert the pulses output by the pulse-generator subcircuit. Some of these embodiments comprise a second transmission-line segment having third and fourth conductors, wherein the third conductor couples the second end of the second conductor to a third DC potential and the fourth conductor is connected to the third DC potential at an end closest to the first pulse-generator subcircuit and connected to a first output node at the opposing end. The second and third DC potentials may be same (or approximately the same) in some embodiments, such as when they are both at ground potential. In other embodiments, however, the second and third DC potentials may be different. Further, the characteristic impedance of the second transmission-line segment is preferably, although not necessarily, matched to the characteristic impedance of the transmission-line segment in the pulse-generator subcircuit. Likewise, the length of the transmission-line segment in the inverting delay-line subcircuit is preferably, although not necessarily, greater than the length of the transmission-line segment in the pulse-generator subcircuit.

Similarly, several embodiments of the circuits described above may further comprise a delay-line subcircuit that includes a transmission-line segment having third and fourth conductors, wherein the third conductor couples the second end of the second conductor (of the pulse-generator subcircuit) to a first output node. Again, the characteristic impedances of the transmission-line segments are preferably, but not necessarily, at least approximately equal, and the length of the transmission-line segment in the delay-line subcircuit is preferably, but not necessarily, greater than the length of the transmission-line segment in the pulse-generator subcircuit.

In still other embodiments, a circuit comprising a pulse-generator subcircuit and a delay-line subcircuit, as described above, may further include a second pulse-generator subcircuit and an inverting delay-line subcircuit coupling the second pulse-generator subcircuit to the first output node, so that the delay-line subcircuit's fourth conductor is connected to a third DC potential at an end closest to the first pulse-generator subcircuit and is connected to the third DC potential via a first selectively operable isolating switch at the opposing end. In these embodiments, the inverting delay-line subcircuit comprises a third transmission-line segment having fifth and sixth conductors, configured so that the fifth conductor couples an output of the second pulse-generator subcircuit to the third DC potential, via a second selectively operable isolating switch, and the sixth conductor is connected to the third DC potential at an end closest to the first pulse-generator subcircuit and connected to the first output node at the fourth conductor's opposing end. These embodiments permit the generation of independently adjustable positive-going and negative-going pulses. In some of these circuits, the second pulse-generator subcircuit is coupled to a second power-supply subcircuit configured to supply a fourth DC potential to the first pulse-generator subcircuit, while in others, the same power-supply subcircuit is coupled to both pulse-generator subcircuits. The lengths of the transmission-line segments within the two pulse-generator subcircuits may be the same, in some embodiments, or differ, in others. Accordingly, the possible range of pulse widths may be the same or differ, for the positive-going and negative-going pulses.

Of course, those skilled in the art will appreciate that the present invention is not limited to the above features, advantages, contexts or examples, and will recognize additional features and advantages upon reading the following detailed description and upon viewing the accompanying drawings.

DETAILED DESCRIPTION

As briefly mentioned above, opthalmological surgery is one field (of many) in which high-voltage generators may be employed. For example, U.S. patent application Ser. No. 12/618,244, filed 13 Nov. 2009, describes various embodiments of an eye surgery apparatus that includes a probe comprising two or more electrodes and configured for delivery of a high-intensity pulsed electrical field to a surgical site within an eye. In particular, this patent application, referred to hereinafter as "the '244 application," the entire contents of which are incorporated herein by reference, describes systems that include a transducer configured to monitor one or more surgical parameters within the eye during application of a high-intensity pulsed electrical field to the surgical site. The described systems further include a pulse-generation circuit configured to generate a series of electrical pulses for application to the electrodes to create the high-intensity pulsed electrical field, and a control circuit configured to automatically adjust one or more characteristics of the series of electrical pulses, based on the monitored surgical parameters. With these systems, characteristics of the high-intensity pulses applied to the surgical site can be automatically adjusted, based on the monitoring of one or more surgical parameters within the eye during the application of the high-intensity pulsed electrical field. In particular, the amount of energy delivered, and the profile of the energy delivery, can be limited to levels necessary for effective operation without over-exposing the vitreous of the eye.

Figure 2:
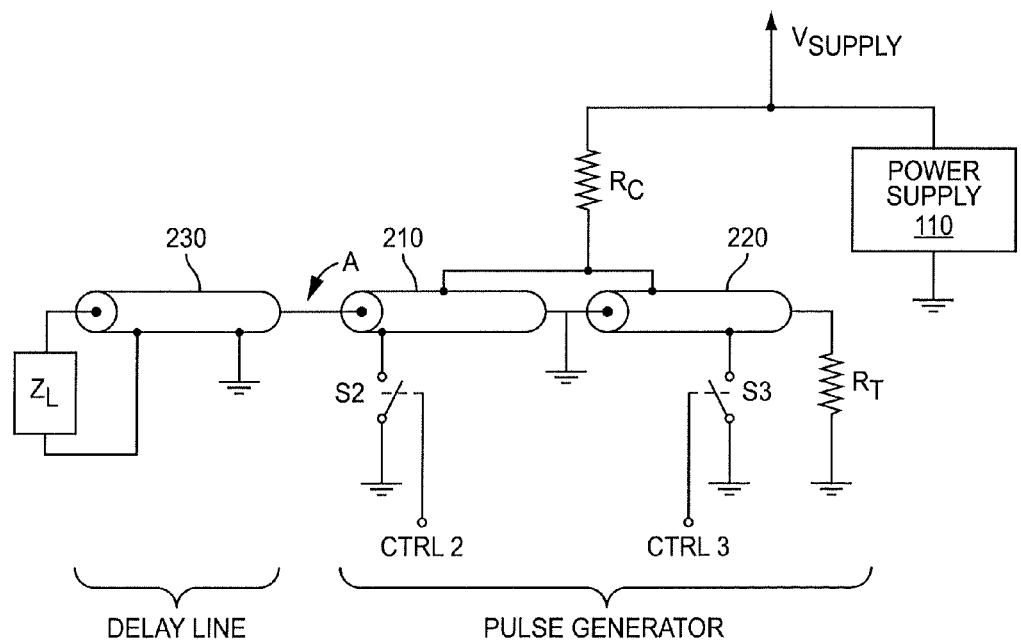
FIG. 2 illustrates schematically a pulse-generator circuit including a delay line.

The systems described in the '244 application involve the use of a pulse generator capable of delivering high-voltage pulsed energy. The techniques described herein may be used to produce such a pulse generator that has the capability to deliver pulses, with adjustable pulse widths and delays, to a load that may present a varying impedance to the pulse generator. Of course, while ophthalmic surgery is one application for the pulse-generator circuits and pulse generating techniques disclosed herein, the applicability of these circuits and techniques is by no means limited to the fields of ophthalmology or to medical devices FIG. 2 illustrates schematically a pulse-generator circuit based on the use of a charged transmission line for energy storage. The circuit of FIG. 2 includes a pulse-generator portion, with an energy-storing segment of transmission line (consisting of two transmission-line segments 210 and 220), and a delay-line portion, consisting of another segment of transmission line 230 coupled to a load impedance $Z_L$. Although the delay-line transmission-line segment 230 may be of any length, it is generally selected to be longer than the longest pulse width generated by the pulse-generator circuit; in some cases it may be much longer, allowing a generally arbitrary separation between the pulse-generator subcircuit and the load. The characteristic impedance of delay line transmission-line segment 230 need not be matched to the load impedance $Z_L$, but is generally matched to the terminating resistance $R_T$, as are the pulse-generator transmission-line segments 210 and 220. A characteristic impedance of 50 ohms may be frequently used, as coaxial transmission lines with that impedance and having sufficient breakdown voltages are readily available.

The pulse-generator transmission-line segments 210 and 220 effectively comprise a split transmission-line segment, with the center conductor of both tied to ground at the center and the outer conductor of both segments charged to a DC potential $V_{SUPPLY}$ provided by power supply 110, through the charging resistor $R_C$. (The pictured charging circuit is perhaps the simplest available; other charging circuit configurations are possible.) One end of the center conductor of the split transmission-line segment formed by segments 210 and 220 is terminated with a termination resistance $R_T$; as noted above, this resistance is generally matched to the characteristic impedance of the transmission-line segments. The other end is coupled to the load, through delay-line transmission-line segment 230. Pulses are generated with the pulse-generator transmission-line segments 210 and 220 and delivered to the load through the delay-line portion of the circuit.

Figure 1:
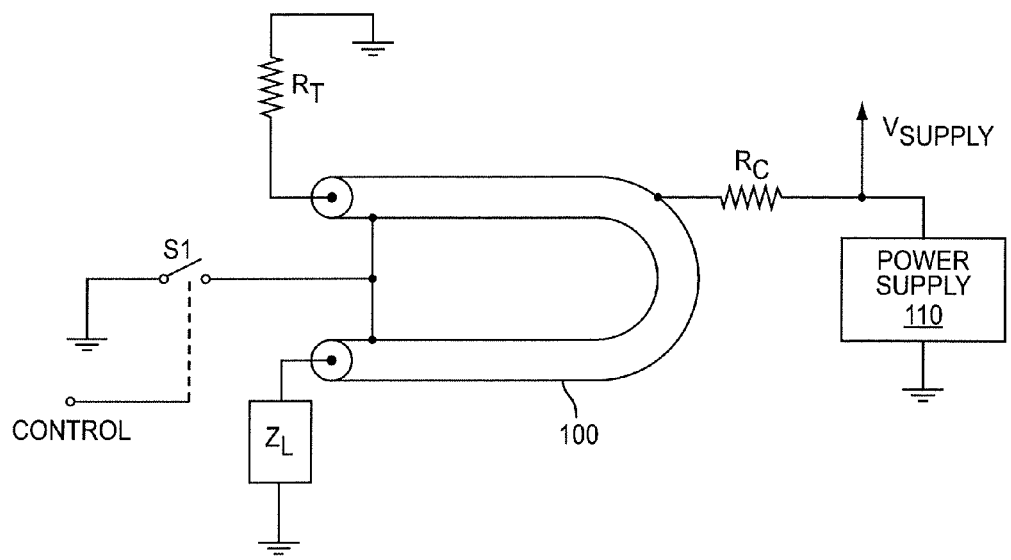
FIG. 1 illustrates schematically a high-power pulse-generator circuit.

In the circuit pictured in FIG. 1 and discussed above, the pulse width produced by the circuit is fixed, as it is determined solely by the length of the transmission line 100. In the circuit of FIG. 2, in contrast, the pulse width is adjustable. While the total length of the transmission-line segments 210 and 220 sets an upper limit to the pulse width, the actual pulse width may be controlled by independently controlling the operation of switches S2 and S3, which selectively couple opposing ends of the pulse-generator subcircuit to ground.

The operation of the pulse-generator circuit of FIG. 2 is best understood by first considering the case where both switches S2 and S3 are closed at the same time. In this event, the circuit operates similarly to the circuit of FIG. 1, which uses only a single switch. Prior to the closing of switch S2, the potential at point A is ground. The closing of switch S2 (using control line CTRL2) immediately lowers the potential at the left-hand end of the outer conductor of transmission-line segment 210 by $V_{SUPPLY}$ relative to its former ground potential. Assuming that the characteristic impedance of transmission-line segment 230 is equal to that of transmission-line segment 210, this change in potential is split evenly between the two segments, so that the potential at point A jumps immediately to $-V_{SUPPLY}/2$. In order to maintain this output voltage, energy begins to flow along the transmission-line segment 210. This results in a voltage wave front, having a magnitude of $-V_{SUPPLY}/2$, moving rightward along transmission-line segment 210. Simultaneously, another voltage wave front, also with a magnitude of $-V_{SUPPLY}/2$, begins propagating to the left along delay-line transmission-line segment 230, towards the load $Z_L$.

At the same time, the closing of switch S3 causes a similar effect at the right-hand end of transmission-line segment 220. Thus, a third voltage wave front, also with a magnitude of $-V_{SUPPLY}/2$, begins to move leftward, from termination resistor $R_T$, along transmission-line segment 220. Eventually, this third voltage wave front arrives at point A, and continues to propagate towards load $Z_L$ along segment 230, lagging the first voltage wave front by a delay set by the combined length of segments 210 and 220.

If the switches S2 and S3 are closed at time $t_0$, then the first wave front arrives at load $Z_L$ at time $t_1=t_0+L_{DELAY}$, where $L_{DELAY}$ is the electrical length (in units of time) of the delay-line segment 230. This first wave front forms the leading edge of the pulse delivered to the load $Z_L$; this pulse's amplitude will depend on the impedance of load $Z_L$. The third wave front, which effectively terminates the pulse delivered to load $Z_L$, arrives at load Z, at time $t_2=t_1+L_{PULSE}$, where $L_{PULSE}$ is the electrical length of the pulse-generator subcircuit (i.e., the combined electrical length of segments 210 and 220). Thus, the width of the pulse delivered to load $Z_L$ is $t_2-t_1=L_{PULSE}$.

Given that the termination resistor $R_T$ is matched to the characteristic impedance of the pulse-generator transmission-line segments, the rightward-traveling wave front is terminated at termination resistor $R_T$, i.e., no reflection is transmitted back towards the load. On the other hand, load $Z_L$ might not be matched to the characteristic impedance of the transmission-line segment 230; in this case, the front edge and back edge of the pulse will each generate reflections when they encounter the load $Z_L$. However, these reflections will eventually be absorbed by the termination resistance $R_T$, and no other reflections will occur. Accordingly, while the amplitude of the pulse delivered to load $Z_L$ is affected by the load's impedance, the pulse width is independent of the impedance. This is important when the impedance of the load is unknown, or may vary from time to time, or when the load impedance is sufficiently high or low that a reliable matching circuit is difficult to realize.

In the example scenario described above, switches S2 and S3 were closed simultaneously, resulting in a pulse width that depends solely on the electrical length of the pulse-generator transmission-line subcircuit. Independently closing switches S2 and S3 at different times allows the pulse width to be controlled, from widths that are substantially shorter than the electrical length of the pulse generator, to widths that are nearly twice as long. The former (short widths) can be produced by closing switch S3 before switch S2, so that the traveling wave that forms the back end of the pulse gets a "head start" on the traveling wave that forms the front end. Alternatively, closing switch S2 before switch S3 lengthens the pulse, as the back end of the pulse is delayed relative to the front end. Accordingly, selectively and independently controlling the closing of switches S2 and S3 allows the pulse width (as well as the pulse's absolute timing) to be adjusted. Opening the switches again allows the pulse-generator circuit to re-charge (at a time constant determined by $R_C$ and the capacitance of the transmission-line segments); thus, a train of pulses, each with independently controllable widths and timings, can be generated with the circuit of FIG. 2.

In the circuit of FIG. 2, the pulses delivered to the load $Z_L$ are negative-going, assuming that $V_{SUPPLY}$ is positive. A positive-going pulse can be generated instead by simply substituting a negative supply voltage (or by reversing the $V_{SUPPLY}$ and ground connections in the circuit illustrated in FIG. 2). Alternatively, a pulse-generator subcircuit like that shown in FIG. 2 can be connected to the load $Z_L$ using an inverting delay-line structure, to convert the positive-going pulse into a negative-going pulse.

Figure 3:
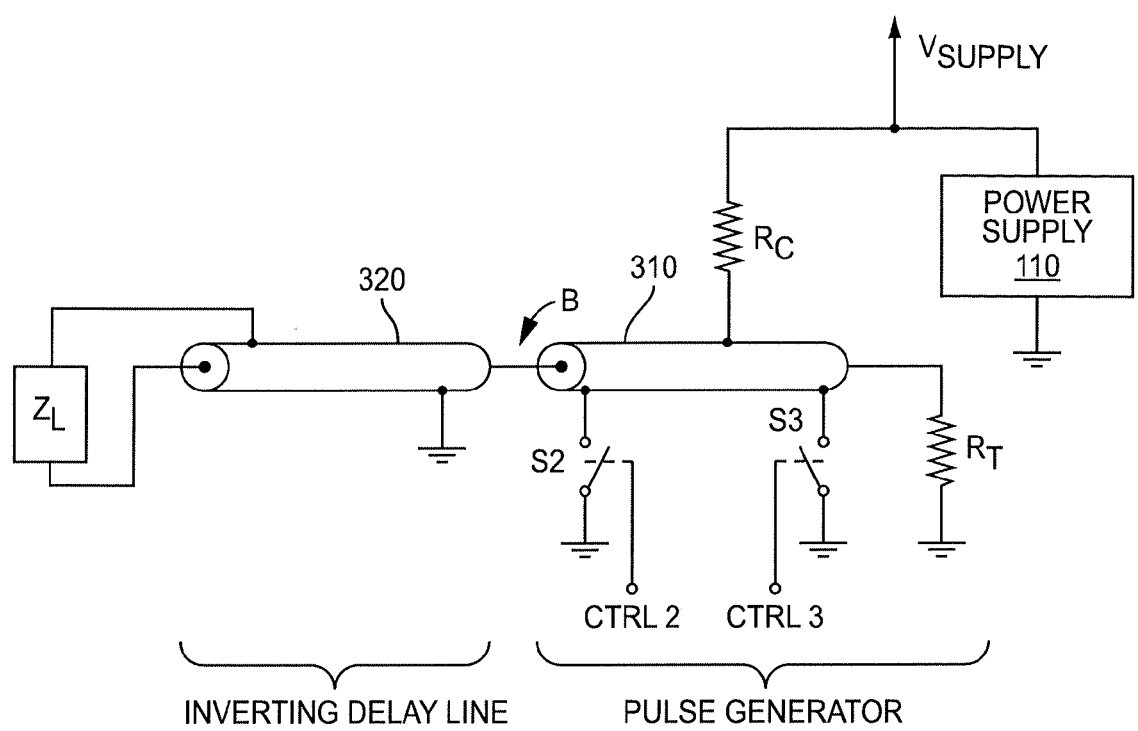
FIG. 3 illustrates another embodiment of a pulse-generator circuit, including an inverting delay line.

One such circuit is illustrated in FIG. 3. In this circuit, the pulse-generator subcircuit comprises a single transmission-line segment 310; while the details of the wave propagation within the transmission-line segment will differ slightly from those in the circuit of FIG. 2, the pulse-generator subcircuits of these two circuits are functionally identical (provided that the electrical length of transmission-line segment 310 is the same as the total length of transmission-line segments 210 and 220).

The functional difference between the circuits of FIGS. 2 and 3 results from the connections to the delay-line portion of each circuit. In both circuits, the load impedance $Z_L$ is connected across the delay-line transmission-line segment. In FIG. 2, the closest end of that transmission-line segment is grounded, while in FIG. 3, it is not. This results in an inversion of the pulse generated at point B, when it is ultimately delivered to load impedance $Z_L$. Otherwise, the operation of the circuit in FIG. 3 is similar to that of FIG. 2. In both circuits, the absolute timing and the width of the pulses delivered to the load impedance $Z_L$ can be controlled by selectively and independently connecting the ends of the pulse-generator subcircuit to ground, via switches S2 and S3.

Figure 4:
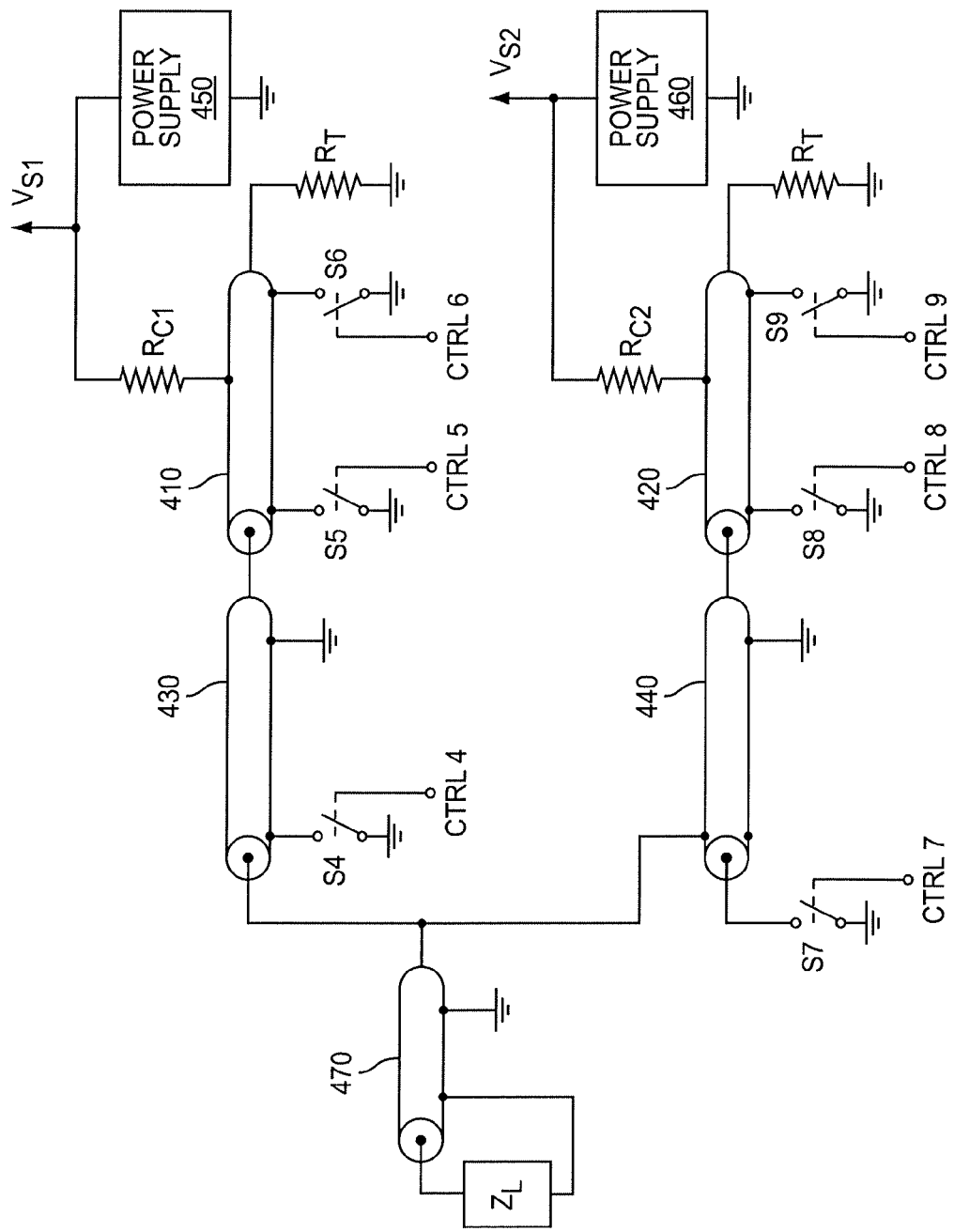
FIG. 4 schematically illustrates a pulse-generator circuit configured to generate dual-polarity pulses.

Multiple pulse-generator circuits can be combined, to provide even more flexibility and control. One such combination circuit is illustrated in FIG. 4. Here, delay-line segment 430 and pulse-generator segment 410 generate negative-going pulses for delivery to load $Z_L$, via delay-line segment 470. The timing and width of these pulses can be controlled via switches S5 and S6, while the amplitude of these pulses depends on the DC potential $V_{S1}$ supplied by power supply 450. Inverting delay-line segment 440 and pulse-generator segment 410, on the other hand, generate positive-going pulses for delivery to load $Z_L$, also via delay-line segment 470. The timing and width of these positive-going pulses can be separately and independently controlled via switches S8 and S9, while the amplitude of these pulses depends on the DC potential $V_{S2}$ supplied by power supply 460. (Of course, both pulse-generator subcircuits could be charged from a single power supply.) Switches S4 and S7 serve to isolate the two pulse-generator subcircuits from one another—when S4 is open, the top pulse-generator subcircuit is "invisible" to the other, while opening S7 isolates the bottom pulse-generator subcircuit from the other.

Those skilled in the art will appreciate that the various DC potentials shown in FIGS. 2-4 can be arbitrarily set. Thus, while it may be particularly convenient to use DC ground as shown in the figures, another DC potential may be substituted for DC ground in any of these figures. Indeed, those skilled in the art will understand that the illustrated circuits and the accompanying descriptions have been provided for purposes of illustration and example, and the present invention may be carried out in other ways than those specifically set forth herein without departing from essential characteristics of the invention. The present embodiments are thus to be considered in all respects as illustrative and not restrictive, and all changes coming within the meaning and equivalency range of the appended claims are intended to be embraced therein.

What is claimed is:

1. A circuit comprising a first pulse-generator subcircuit and a first power-supply subcircuit configured to supply a first DC potential to the first pulse-generator subcircuit, wherein the first pulse-generator subcircuit comprises:

a first transmission-line segment comprising first and second conductors and having a first length, wherein the first conductor is coupled to the power-supply subcircuit;

a first terminating resistor coupled to a first end of the second conductor of the first transmission-line segment;

first and second switches, controlled by first and second timing signals, respectively, and configured to selectively and independently connect respective first and second ends of the first conductor to a second DC potential;

a delay-line subcircuit comprising a second transmission-line segment having third and fourth conductors, wherein the third conductor couples the second end of the second conductor to a first output node; and a second pulse-generator subcircuit and an inverting delay-line subcircuit coupling the second pulse-generator subcircuit to the first output node, wherein the delay-line subcircuit's fourth conductor is connected to an end closest to the first pulse-generator subcircuit and is connected to a first selectively operable isolating switch at the opposing end, and wherein the inverting delay-line subcircuit comprises a third transmission-line segment having fifth and sixth conductors, wherein the fifth conductor couples an output of the second pulse-generator subcircuit to a second selectively operable isolating switch, and the sixth conductor is connected to an end closest to the first pulse-generator subcircuit and connected to the first output node at the fourth conductor's opposing end.

2. The circuit of claim 1, wherein the first DC potential exceeds about 1000 volts, and the second DC potential is ground potential.

3. The circuit of claim 1, wherein the first terminating resistor has an impedance at least approximately equal to the characteristic impedance of the first transmission-line segment.

4. The circuit of claim 1, wherein the first conductor comprises an outer conductor of a coaxial transmission-line segment and the second conductor comprises an inner conductor of the coaxial transmission-line segment.

5. The circuit of claim 1, wherein the first transmission-line segment comprises two subsegments connected in series, wherein the second conductor is connected to the second DC potential at a point between the two subsegments.

6. The circuit of claim 1, further comprising an inverting delay-line subcircuit comprising a second transmission-line segment having third and fourth conductors, wherein the third conductor couples the second end of the second conductor to a third DC potential and the fourth conductor is connected to the third DC potential at an end closest to the first pulse-generator subcircuit and connected to a first output node at the opposing end.

7. The circuit of claim 6, wherein the second and third DC potentials are at least approximately equal.

8. The circuit of claim 6, wherein the characteristic impedances of the first and second transmission-line segments are at least approximately equal.

9. The circuit of claim 6, wherein the length of the second transmission-line segment is greater than the length of the first transmission-line segment.

10. The circuit of claim 1, wherein the characteristic impedances of the first and second transmission-line segments are at least approximately equal.

11. The circuit of claim 1, wherein the length of the second transmission-line segment is greater than the length of the first transmission-line segment.

12. The circuit of claim 1, wherein the second pulse-generator subcircuit is coupled to a second power-supply subcircuit configured to supply a fourth DC potential to the first pulse-generator subcircuit.

13. The circuit of claim 1, wherein the second pulse-generator subcircuit comprises a fourth transmission-line segment comprising:
   first and second conductors and having a second length;
   a second terminating resistor coupled to a first end of the second conductor of the fourth transmission-line segment; and
   third and fourth switches, controlled by third and fourth timing signals, respectively, and configured to selectively and independently connect respective first and second ends of the first conductor to the second DC potential.

14. The circuit of claim 13, wherein the second length differs from the first length.

* * * * *